US010468056B2

(12) United States Patent
Weissner et al.

(10) Patent No.: US 10,468,056 B2
(45) Date of Patent: Nov. 5, 2019

(54) CONDUCTIVE PROBE INTERCONNECTS AND RELATED DEVICES AND METHODS

(71) Applicant: Seagate Technology LLC, Cupertino, CA (US)

(72) Inventors: Stefan A. Weissner, Bloomington, MN (US); Wayne A. Bonin, North Oaks, MN (US); James R. Krolnik, Brooklyn Park, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 256 days.

(21) Appl. No.: 15/795,684

(22) Filed: Oct. 27, 2017

(65) Prior Publication Data

US 2019/0130938 A1    May 2, 2019

(51) Int. Cl.
*G11B 5/48*    (2006.01)
*G11B 5/455*   (2006.01)
*G01R 33/12*   (2006.01)
*G11B 5/00*    (2006.01)

(52) U.S. Cl.
CPC .......... *G11B 5/455* (2013.01); *G01R 33/1207* (2013.01); *G11B 5/4826* (2013.01); *G11B 2005/0021* (2013.01)

(58) Field of Classification Search
CPC ... G11B 5/4833; G11B 5/4826; G11B 5/4853; G11B 5/486; G11B 5/6005; G11B 5/4873; G11B 5/5552; G11B 25/043; G11B 5/5521; G11B 5/3912; Y10T 29/49025; Y10T 29/49027; Y10T 29/4903; Y10T 29/49032; F16C 2370/12; G01R 33/093
See application file for complete search history.

(56) References Cited

U.S. PATENT DOCUMENTS 8,089,730 B1    1/2012 Pan et al.
8,514,522 B1*   8/2013 Pan ...................... G11B 5/4853
                                                324/755.01

* cited by examiner

*Primary Examiner* — Alesa Allgood
(74) *Attorney, Agent, or Firm* — Kagan Binder, PLLC (57) ABSTRACT

Described are probe assemblies that include multiple layers, including at least one layer of probe bodies; suspension assemblies and components thereof, e.g., head gimbal assemblies, that include a probe assembly as described; and methods of using the probe assemblies and suspension assemblies.

20 Claims, 9 Drawing Sheets

CONDUCTIVE PROBE INTERCONNECTS AND RELATED DEVICES AND METHODS

FIELD OF THE INVENTION

The invention relates to probe assemblies that include multiple layers, including at least one layer of probe bodies; suspension assemblies and components thereof, e.g., head gimbal assemblies, that include a probe assembly as described; and methods of using the probe assemblies and suspension assemblies.

BACKGROUND

Hard disk drives used for long term magnetic storage of digital information are ubiquitous and essential devices in our modern world. A hard disk drive device includes one or more rotating disks within an enclosure. To use the hard disk drive to store and retrieve digital information, the hard disk drive device also includes components adapted to read and write information from and onto the magnetic disk. A "head gimbal assembly" includes a suspension, a gimbal, a flex circuit, and a slider. The slider includes one or more magnetic read-write heads that include a miniaturized transducer for reading or writing data from or onto the rotating disk, and an air bearing surface to properly position the read-write heads above the disk as the disk rotates. The disk is coated with media that can be selectively magnetized by a read-write head, to store digital information in a manner that allows for retrieval of the information, also by a read-write head.

The head gimbal assembly is attached to an actuator arm that is part of the disk drive, and is held by the actuator arm to place the slider at a location that is adjacent to but not touching the surface of the disk. As the disk spins, air flow at the spinning disk surface interacts with the air bearing surface of the slider to create a cushion or "bearing" of air located in the space between the slider and the disk surface. This cushion of air, or "air bearing," suspends the read-write head at a desired distance from the disk surface. If the read-write head is too far away from the surface, signal loss will occur, and if the head is too close to the surface the head could contact the surface, i.e., "crash," resulting in damage to the head or the disk and often a complete hard drive failure.

The hard disk drive industry is constantly in pursuit of new ways to increase the amount of data that can be stored on an area of a magnetic disk, sometimes referred to as "areal density." To increase areal density, the size of an amount of stored information on a disk surface may be reduced. One way to reduce the size of an amount of data relative to a disk surface is to use a slider and read-write heads that are smaller in size compared with previous versions. Reducing the size of a read-write head may also involve reducing the size of other features of the slider, such as the sizes of attendant components of the slider, for example electrical contacts (a.k.a., "contact pads") used to electrically connect the slider to a head gimbal assembly. Accordingly, recent developments in magnetic recording technology have involved the development of sliders having ever-smaller components, including smaller and smaller contact pads with which a slider and its integral read-write heads are electrically connected to a head gimbal assembly.

By certain approaches of increasing areal density, a slider and hard disk media may be designed to perform magnetic recording by an improved recording technique that allows for recording data as smaller-sized bits. One such technique, referred to as perpendicular magnetic recording (PMR), allows for writing individual pieces (bits) of data onto a hard magnetic disk surface in a perpendicular direction, as compared to a longitudinal direction. As another, more recent approach, smaller-sized data recordings can be placed more closely together by use of a recording medium that has a higher coercivity. To record a bit of data onto the higher coercivity medium, the medium is heated at the location bit being recording. This process may be referred to as "thermally-assisted magnetic recording" or "heat-assisted magnetic recording" (HAMR), and requires a magnetic recording head (as a component of a slider) that is capable of delivering heat to a magnetic disk in a highly precise fashion, for example by use of a laser diode unit (LDU).

In today's magnetic hard disk drive devices, each magnetic read or write head ("read head," for short) is included as part of a head-gimbal assembly, which includes a suspension assembly that provides electrical connection to the read head. The suspension assembly typically includes a laminated flexure to carry electrical signals to and from the read head. The head-gimbal assembly is a component of a head-stack assembly that typically includes multiple head-gimbal assemblies, with each head gimbal assembly being attached at an end of an arm of an actuator.

Typically, as part of a finished suspension assembly, a read head is bonded to a portion of the laminated flexure by use of a substantially permanent adhesive. Consequently, if the read head is found to be defective after the read head has been attached to the head gimbal assembly, the entire suspension assembly must ordinarily be discarded, because the permanent bond cannot usually be broken without damaging the laminated flexure.

To prevent the need to discard a suspension assembly after a read head has been installed and subsequently found to be defective, a typical practice is to test a read head before permanently bonding the read head to the head gimbal assembly. If the read head is found to be defective by testing performed before the read head is bonded to the head gimbal assembly, the read head alone can be to discarded or repaired. Such functional testing (e.g., so-called "dynamic electrical testing" or "DET") of a read head separate from the suspension assembly is more accurate if the testing conditions closely resemble actual conditions during operation of the read head. For example, the accuracy of the dynamic electrical testing may be improved by holding and electrically connecting the read head using a suspension assembly that is similar to the type of suspension assembly to which the read head will be bonded if its function is deemed acceptable.

Test assemblies that simulate a use condition during dynamic electrical testing have been proposed and used commercially, and must be continuously updated as the designs of read heads advance to include smaller, newer, or additional features. For example, as new versions of read heads are developed to include smaller or an increased number of contact pads, new designs of dynamic electrical testing devices must be developed to accommodate read heads (e.g., sliders) with the reduced-size features. As another example, as new sliders that include additional electrical functionality such as a laser diode unit are developed and commercialized, new systems for dynamic electrical testing must be developed to test these new read heads.

SUMMARY

With the presently-described invention, Applicant has identified probe assemblies useful for systems for dynamic electrical testing of read heads (e.g., in the form of "sliders"). The probe assemblies contain multiple vertical layers including at least one layer that includes multiple probe bodies, for example an array of probe bodies that are part of or that make up a "probe body layer." The multi-layer probe assemblies include the probe bodies as part of a single layer of the assembly, with the probe bodies having dimensions that extend to a substantial extent in a width direction (referred to as a "y-direction"), and also to a substantial extent in a length direction (referred to as an "x-direction" and extending between a front portion of the assembly and a trailing portion of the assembly), while extending to a much less substantial extent in a direction of a thickness (referred to as a "z-direction"). In certain example assemblies, the trailing probe body can be held in place relative to the assembly, directly or indirectly, e.g., through a spacer layer, by contacting an adhesive layer that is stationary relative to the assembly, e.g., relative to a base layer.

More generally, a feature of an assembly that is referred to as a "layer," such as a probe body layer, an adhesive layer, a spacer layer, or a base layer, is a structure that has dimensions that extend to a substantial extent in a width direction (the "y-direction), and also to a substantial extent in a length direction (the "x-direction"), while extending in a less substantial extent in a direction of a thickness (the "z-direction").

The probe assembly is useful to electrically couple (i.e., "interconnect") a read head to a head gimbal assembly as part of a suspension assembly of a dynamic electrical testing system or device. The probe assembly can include a plurality of conductive probe bodies as part of a probe body layer, each probe body including a front probe body portion that includes a spring segment, and a trailing probe body segment. The trailing probe body segment can be held in place relative to the assembly, with the spring segment being allowed to flex or compress during use in the x-direction and in the y-direction, when a front probe end of the probe body engages a contact pad at a trailing face of a read head. The trailing probe body segment can be adapted to connect, directly or indirectly, to a contact pad of a laminated flexure of a head gimbal assembly or to another portion or feature of a suspension assembly of a dynamic electrical testing system or device.

The multi-layer probe assemblies of the present description differ from previous probe assemblies, among other ways, by being constructed of multiple layers that extend within the assembly in x-direction and in the y-direction, and that have a less substantial thickness in the z-direction. A spring body layer, for example, includes spring segments that extend substantially in the x-direction and the y-direction, but with only a small thickness in the x-direction, allowing for movement (e.g., compression and flexing) of the spring segments in the x-direction and the y-direction.

Various advantages result from the use of layers that extend substantially in the x-direction and y-direction, and that have only a small thickness in the z-direction. The layers can be assembled within the probe assembly in a vertical sequence, e.g., by stacking the layers in the vertical (z) direction of the assembly. Layers that extend in substantially the x-direction and the y-direction can be formed by methods of etching a thin film to produce highly precise dimensional control in the x- and the y-directions. This allows, as desired, for smaller and more precise dimensions of features of probe bodies in the x- and the y-directions, including smaller distances of spacings between probe bodies in the x- and the y-direction. Probe bodies and probe ends can be produced with smaller dimensions in the y-direction (width), and placed more closely together in the y-direction. Closer probe body ends can allow for a probe assembly that can electrically engage a read head (e.g., slider) that includes a larger number of electrical contact pads on a face of the read head, smaller contact pads, or both.

Additionally, and optionally, placing an array of probe bodies in a single layer of a multi-layer probe assembly can allow for multiple layers of sensor bodies to be included in the probe assembly (i.e., multiple "probe body layers"), with each probe body layer being located at a different location of the multi-layer assembly in the z-direction. The probe bodies of each of the different probe body layers can be used to contact a different set of contact pads of a read head, with the contact pads also being separated in the z-direction. For example, an array of probe bodies of one probe body layer of a multi-layer probe assembly can engage contact pads of a read head that engage transducers, e.g., for perpendicular magnetic recording (PMR), while an array of probe bodies of a second layer of the same multi-layer probe assembly can engage contact pads of the same read head but that are connected to a different electronic function of the read head, such as a laser diode unit (LDU) of a read head that performs heat assisted magnetic recording (HAMR).

The invention thus provides example probe assemblies that can be used in a dynamic electrical testing system for testing read heads, a.k.a. "sliders," including HAMR and PMR sliders. The probe assemblies can be used in these testing systems for electrical testing of HAMR, PMR, and other types of sliders to identify electrically defective sliders before the slider is incorporated into a head gimbal assembly. In useful embodiments, a multi-layer probe assembly as described can be assembled with a mechanical clamp as part of a head gimbal assembly that removably holds the slider in a suspension assembly of a dynamic electrical testing system. One example of a probe assembly of the description includes a first array of probe bodies in a first probe body layer that function as electrical interconnect probes for electrically contacting slider end bond pads (for PMR recording), and a second array of probe bodies of a second probe body layer that function as electrical interconnect probes for electrically contacting LDU pads of the same (HAMR) slider, with the two arrays of contact pads of the HAMR slider being located at two different levels in a z-direction of the HAMR slider. In this and other example probe assemblies, the use of a multi-layer probe assembly as described can provide electrical interconnection to slider end bond pads with very narrow pitch, e.g., from 9 up to 15 pads in a row in the width direction of a trailing face of a slider such as a PMR slider.

Different from past probe assembly designs, the present multi-layer probe assemblies place electrical probe bodies within a layer of the assembly, among multiple layers that are stacked in the vertical (z) direction. This enables electrical connection to both slider end bond pads (e.g., PMR contact pads) and to HAMR LDU pads of a the same slider, at the same time, for dynamic electrical testing of PMR contact pads and LDU contact pads of the same slider using a single suspension assembly and dynamic electrical testing system. For sliders that are being or will be developed to include increasingly smaller contact pads that may be placed more closely together along a face of the slider, with the total number of contact pads on a slider potentially being increased relative to past sliders, e.g., PMR sliders, the invention provides extremely accurate sizing and placement of the probe bodies and probe ends in both the length and the width direction, because all probe bodies of a probe body layer are produced using a single etch layer.

In one aspect, the invention relates to a multi-layer electrical probe assembly that includes: a base layer having a width in a y-direction, a length in an x-direction extending between a front assembly portion and a trailing assembly portion, and a thickness in a z-direction; an adhesive layer having a top adhesive surface; and a probe body layer spaced in a z-direction from the adhesive layer and comprising an array of multiple electrically conductive probe bodies. Each probe body includes: a front probe body portion that includes a spring segment capable of flexing in the x-direction and along the y-direction, and a front probe end at a front end of the spring segment; and a trailing probe body segment held in place relative to the base layer.

In another aspect the invention relates to a suspension assembly for holding a read head and providing electrical connection to the read head. The suspension assembly includes: a laminated flexure comprising a plurality of conductive lines; a read head clamp attached to the laminated flexure, the read head clamp comprising a wall positioned to face a trailing face of the read head, and an electrical probe assembly aligned with the wall and having a width in a y-direction and a length in an x-direction extending between a front assembly portion and a trailing assembly portion, the probe assembly that includes an array of multiple electrically conductive probe bodies. Each probe body includes: a front probe body portion that includes a spring segment capable of flexing in the x-direction and along the y-direction; a front probe end at a front end of the spring segment, and a trailing probe body segment held in place relative to the electrical interconnect probe assembly. Each front probe end is adapted to contact a contact pad of a read head to produce an electrically conductive engagement between the front probe end and the contact pad. Each trailing probe body segment is electrically connected to one of the plurality of conductive lines.

In another aspect the invention relates to methods of using a suspension assembly as described herein by: placing a read head in the clamp of the suspension assembly, and electronically testing the read head.

BRIEF DESCRIPTION OF THE DRAWINGS

All drawings are schematic and not to scale.

DETAILED DESCRIPTION

The following description relates to multi-layer probe assemblies that are useful as a component of a dynamic electrical testing system for sliders, for engaging contact pads of a read head (also referred to herein as a "slider"). A probe assembly as described includes electrically conductive probe bodies, each of which has a conductive probe end. The slider includes electrically conductive contact pads that correspond to the conductive probe ends and that can be brought into electrical engagement with the probe ends. The probe body includes a second conductive end that can be electrically connected to the dynamic electrical testing system, thereby allowing the probe body to act as an interconnect between the slider and the electrical dynamic testing system.

In example systems, a probe assembly can be assembled with a head gimble assembly in a manner that allows the head gimbal assembly to receive a slider and provide electrical connection between contact pads of the slider and the testing system, by way of the probe bodies of the assembly. In certain embodiments, the probe assemblies include an array of conductive probe bodies each having a spring segment that includes a probe end that can electrically engage a contact pad of a slider. The array of probes is part of a probe body layer that can be assembled with other layers of the multi-layer assembly, optionally including a second probe body layer that includes a second array of probe bodies.

In presently useful examples, a head gimbal assembly can be part of a larger suspension assembly with the combination including a laminated flexure coupled to a clamp assembly that includes an opening for temporarily (removably) receiving a slider to hold the slider in the head gimbal assembly during dynamic electrical testing. The probe assembly is arranged relative to the head gimbal assembly to allow electrical coupling of ends of the probe bodies with contact pads of a face of the slider when the slider is placed in the opening.

As used herein, a "multi-layer" assembly refers to an assembly that includes multiple "layers," with each layer including structure that extends to a major degree in an x-direction, referred to as a length, i.e., the dimension extending between a front portion and a back portion of a probe assembly or a portion or component of a probe assembly. The structure of each layer also extends to a major degree in a y-direction, referred to as a width, which is perpendicular to the x-direction. Each layer also includes a dimension that extends, to a much lesser extent, in a z-direction, perpendicular to both the width and the length, referred to as a thickness, the magnitude of the thickness being substantially less than the magnitude of the length and the magnitude of the width. Thickness of a layer may be substantially uniform over the area (in the x and y directions) of the layer or components of a layer. Thus, each layer has a major dimensional component of a length and a major directional component of a width, e.g., defines a layer that is flat and substantially "planar," with a thickness that is substantially less than the width and the length of the layer.

The multiple layers of the multi-layer assembly are stacked and spaced in the z-direction.

Figure 1A:
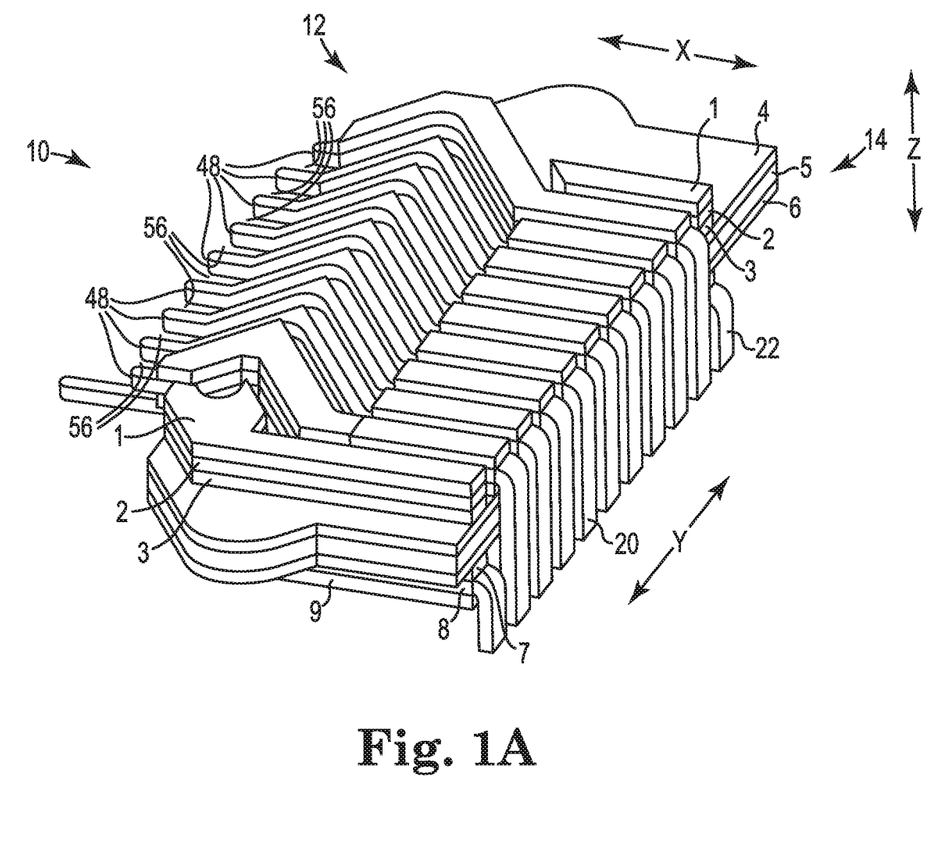
FIGS. 1A and 1B are top perspective and front perspective views of an example multi-layer electrical interconnect probe assembly as described.
Figure 1B:
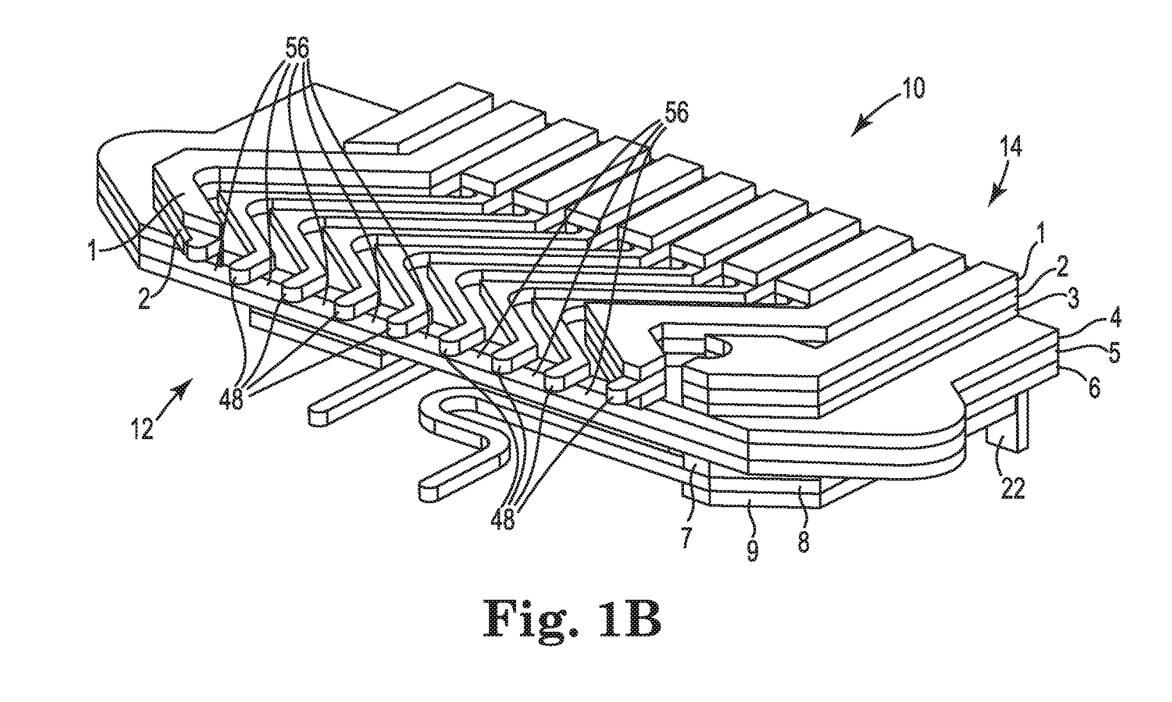

With reference to the figures, FIGS. 1A and 1B show example features of multi-layer electrical interconnect probe assemblies as described. FIG. 1A is a perspective view of a top, side, and trailing direction of assembly 10. Multiple layers of materials make up assembly 10, with each layer extending to a substantial degree in an x-direction and to a substantial degree in a y-direction, i.e., each layer has a substantial width dimension in the y-direction and a substantial length dimension in the x-direction. Each layer has a thickness dimension in a z-direction, with the thickness dimension being substantially less than the width and length dimensions of the layers. The layers, extending substantially in the x and y directions, are stacked and separated in the z-direction.

Example assembly 10 of FIGS. 1A and 1B and the specific layers of assembly 10 are only one possible non-limiting embodiment of the assemblies more generally described and illustrated herein. Moreover, certain layers of exemplary assembly 10, such as the one or more support or stiffener layers, spacer layers, the base layer, and the one or more adhesive layers, may be optional or may be substituted by a comparable or equivalent structure that performs the same function. As illustrated, assembly 10 includes a first probe body layer and a second (optional) probe body layer. Each of the two different probe body layers is adapted to electrically engage one of two different sets of contact pads of a slider, at two different locations along the z-dimension. The presence of two probe body layers is optional and other embodiment of assemblies 10 may include only a single probe body layer.

Referring to FIGS. 1A and 1B, multi-layer electrical interconnect probe assembly 10 generally includes front assembly end 12 and trailing assembly end 14. A length extends in the x-direction between front assembly end 12 and trailing assembly end 14. A width extends in the y-direction perpendicular to the x-direction. The layers have thicknesses and are stacked in the z-direction. Starting at the top of example assembly 10, example assembly 10 includes layers as follows. Layer 1 (the "top" or "uppermost" layer) can be referred to as a support or stiffener layer. Adjacent to (below, in the z-direction) layer 1 is layer 2, which is a probe body layer. Layer 3, below layer 2, is a spacer layer that may also function as a support or stiffener layer between layer 2 and adhesive layer 4, which is below layer 3. Layer 5 is a base layer and layer 6 is a second (lower, optional) adhesive layer. Layers 7, 8, and 9, which are optional, are spacer layer 7, a second probe body layer 8, and stiffener layer 9. Layers 1, 2, and 3 include probe body layer 2, which may be the only probe body layer of the assembly. Optionally, however, one or more additional probe body layers may also be included in the assembly. Layer 8 for example of FIGS. 1A and 1B is a second (e.g., lower) probe body layer. See below.

Figures 2A, 2B, 2C:
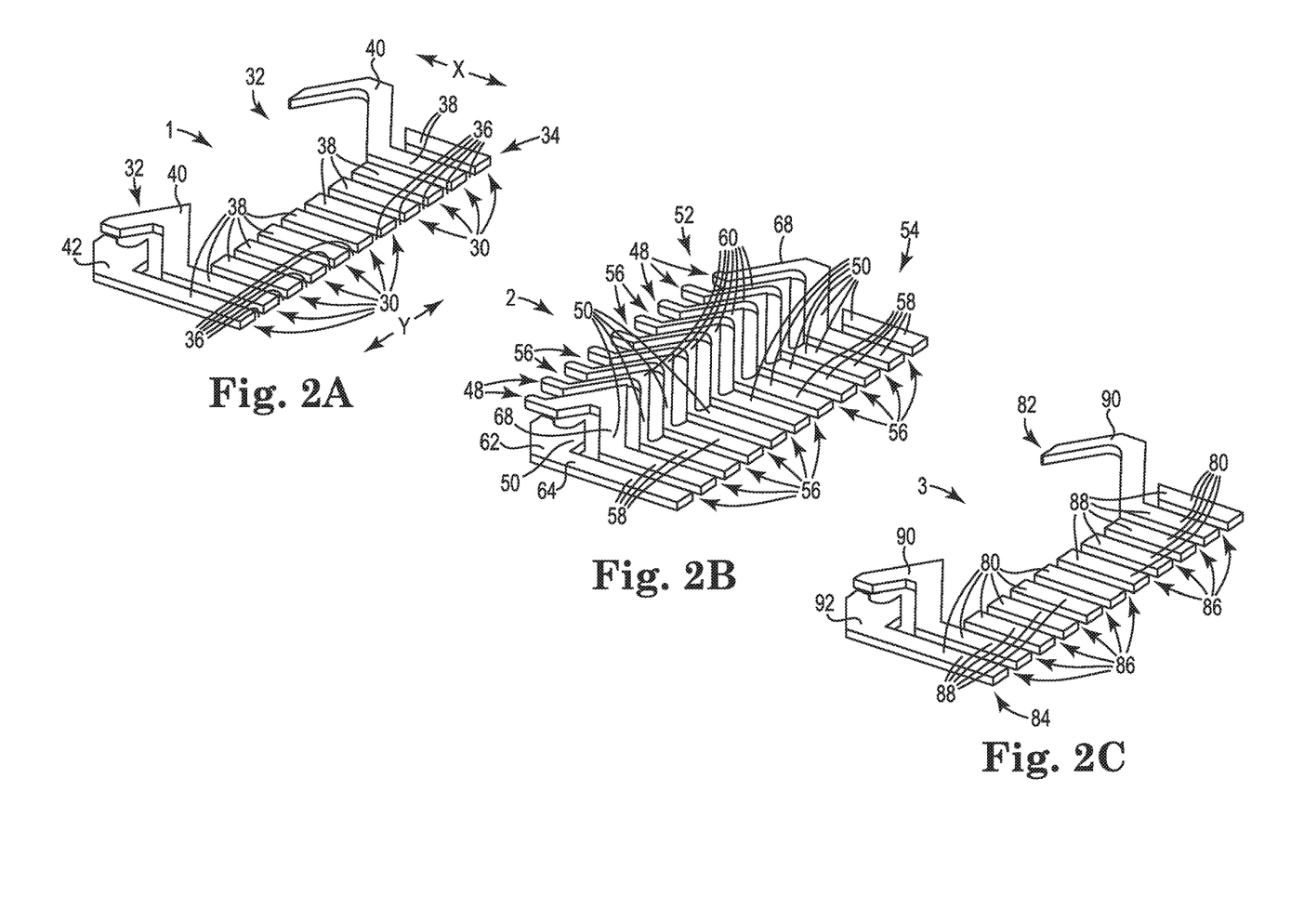
FIG. 2A is a top perspective view of an example stiffener layer of a probe assembly as described.
FIG. 2B is a top perspective view of an example probe body layer of a probe assembly as described.
FIG. 2C is a top perspective view of an example spacer layer of probe assembly as described.

More specifically with respect to support or "stiffener" layer 1 shown at FIG. 2A, this layer (as illustrated) includes an array of multiple stiffener bodies 30, each body 30 extending along a length generally in the x-direction from a front stiffener body end 32 to trailing stiffener body end 34. Stiffener bodies 30 and segments thereof are arranged within layer 1 in an array that aligns at least portions of their structures vertically with structures of an array of probe bodies 50 of probe body layer 2 (see FIG. 2B). Consistent therewith, multiple stiffener bodies 30 are arranged in an adjacent but separated manner in an array or sequence extending in the width direction, with separations 36 located between the sides or edges of each stiffener body 30 and sides or edges of adjacent stiffener bodies 30, with each separation 36 also extending generally in the x-direction between front stiffener body end 32 and trailing stiffener body end 34. Each stiffener body 30 includes at least a trailing stiffener body segment 38 that is adjacent to a trailing stiffener body end 34. As part of an assembly 10, each trailing stiffener body segment 38 can be bonded, e.g., by adhesive, to a top of a probe body 50, or a segment thereof, in probe body layer 2, e.g., along a length and on top of a trailing probe body segment 58 (see FIG. 2B). In this way, each trailing stiffener body segment 38, bonded to a segment of a probe body 50, is effective to reinforce (for added strength), stiffen, or support the segment of the probe body 50 to which the segment of the trailing body stiffener is bonded. In other examples of stiffener layers, the layer may be an insulating material that is continuous, that does not contain the discrete stiffener bodies 30 separated by separation 36, but that otherwise includes features as described that will result in a continuous stiffener layer that effectively functions as a stiffener layer.

Similarly, one or more stiffener bodies 30 can include a forward stiffener body segment 40 adjacent to front stiffener body end 32, which can be bonded, e.g., by adhesive, to a top of a probe body 50, or a segment thereof, e.g., along and on top of a stopper segment of a probe body, e.g., stopper segment 68 of probe body 50, as shown at FIG. 2B. In this way, forward stiffener body segment 40 is effective to reinforce (for added strength), stiffen, or support a stopper segment, e.g., stopper segment 68 of probe body 50.

Alternately or in addition, one or more of stiffener bodies 30 can include a forward stiffener body segment 42 adjacent to front stiffener body end 32, that can be bonded, e.g., by adhesive, to a forward segment of a probe body 50, e.g., along and on top of an end probe body 64, or a segment thereof (see FIG. 2B). In this way, forward stiffener body segment 42 is effective to reinforce (add strength to), stiffen, or support forward segment 62 of end probe body 64.

A stiffener layer such as stiffener layer 1 may be made of any material that can be prepared as an array of stiffener bodies 30 to form stiffener layer 1 as described, for use to incorporate stiffener bodies 30 into a multi-layer assembly as described. The material of stiffener layer 1 may be an insulating material (e.g., a polymer or plastic), a ceramic, or a metal. If the material is a conductive material such as a metal, spaces 36 must be maintained between adjacent stiffener bodies 30. If, instead, stiffener layer 1 is made of a non-conductive or insulating material, spaces 36 may be unnecessary.

A stiffener layer such as stiffener layer 1 can have dimensions that are useful to allow and cause stiffener layer 1 to function to stiffen or support probe bodies 50 of probe body layer 2, or segments thereof. Length and width dimensions of stiffener layer 1, of each individual one of stiffener bodies 30, and of the various segments of stiffener bodies 30, can be selected to align vertically with structures of probe body layer 2, such as segments of individual probe bodies 50. A thickness dimension of stiffener layer 1 and bodies and segments thereof can be selected to be sufficient to strengthen or support one or more structures, segments, or bodies of probe body layer 2. Examples of useful thickness dimensions of stiffener layer 1 and bodies and segments thereof can be in a range from 10 to 50 microns.

As shown at FIG. 2B, probe body layer 2 includes an array of multiple probe bodies 50, each probe body 50 extending along a length generally in the x-direction from a front probe body end 52 to trailing probe body end 54. The multiple probe bodies 50 are also arranged in an array or sequence in the y-direction with separations 56 located between the sides or edges of each adjacent probe body 50 and the sides or edges of adjacent probe bodies 50, with each separation 56 also extending generally in the x-direction between front probe body end 52 and trailing probe body end 34.

A probe body 50 can include a front probe body portion that includes a spring segment 60 and a front probe end 48, a trailing probe body segment 58 that is adjacent to trailing probe body end 54. Spring segments 60 extend in the x-direction and in the y-direction (with a thickness in the z-direction), and all (as illustrated) have the same shape and dimensions in the x- and the y-directions, which allows for the spring segments to be "nested" within the x- and y-directions. Each trailing probe body segment 58 is held in place relative to assembly 10, e.g., relative to base layer 5. Probe layer 2 and probe bodies 50 are spaced in the z-direction from base layer 5 and adhesive layer 4, to allow spring segments 60 to compress in the x direction.

In use, one contact pad (not shown) of a read head is brought into physical engagement with each one of front probe ends 48, which are incorporated into a suspension assembly for electronic testing of read heads. The front probe ends 48 engage the contact pads in a manner to produce an electrical connection between one front probe end 48 and one contact pad of the read head. Each contact pad of the read head places pressure on a spring segment 60 in the x-direction toward trailing end 54. Each spring segment 60 can be compressed to shorten the length of the spring segment in the x-direction, potentially with a small amount of flexing or movement in the y-direction, and substantially no substantial amount of flexing in the z-direction.

As illustrated, stopper segments 68 are relatively wider (in the y-direction), are reinforced by forward stiffener body segments 40 of stiffener layer 1 and by forward spacer body segment 90 of spacer layer 3, and are shorter in length in the x-direction, not extending as far in the forward direction, as compared to spring segments 60. Spring segments 60 may be relatively narrower in the width direction, are not reinforced by a forward stiffener body segment 40 of stiffener layer 1 or by forward spacer body segment 90 of spacer layer 3, and extend a longer length in the x-direction as compared to stopper segments 68. Spring segments 60, therefore, are adapted to compress and move relative to stopper segments 68 when contacted with a contact pad of a read head. Stopper segments 68 are adapted to not allow for a substantial degree of compression, and to thereby function as a stop or end location for a trailing face of a read head when the read head is installed with contact pads abutting front probe ends 48.

A probe body layer such as probe body layer 2, and individual probe bodies 50, may be made of any conductive material that can be prepared as an array of probe bodies 50 to form probe body layer 2 as described, and that can allow for incorporating probe bodies 50 into a multi-layer assembly as described. The conductive material of probe body layer 2 may be any conductive material capable of being formed into probe bodies 50 and aligned and stacked to form assembly 10 as described herein. Examples include metals and metal alloys such as: stainless steel, nickel and nickel alloys, aluminum or an aluminum alloy, gold or a gold alloy, palladium or a palladium alloy, titanium or a titanium alloy, platinum or a platinum alloy, copper or a copper alloy, silver or a silver alloy, or the like.

A probe body layer such as probe body layer 2 and bodies and segments thereof can have dimensions that are useful to allow each individual probe body 50 to function as described herein as part of a probe assembly that is a component of a suspension assembly for electrically connecting (in a temporary fashion) a read head to a dynamic electrical testing system, for electrical testing of the read head. Each probe body 50 functions to physically engage one contact pad of a read head installed in the suspension assembly, and also to electrically interconnect the read head to the testing system to allow electrical testing of the read head by the testing system. Length and width dimensions of each probe body can be desirably small, particularly in a width direction, to allow for the probe assembly to include a number of probe bodies having sufficiently small size (width) and separation to engage a useful or advantageous number of contact pads of a read head.

Regarding dimensions of a conductive probe body, array of probes, and probe assembly, ongoing development of new and improved recording media and hard disk drives includes the development of new sliders that have continually smaller dimensions, smaller contact pads, a greater number of contact pads, or reduced spacing between contact pads. These new slider designs create a need for new probe arrays that can accommodate the new slider designs with correspondingly small probe dimensions and probe spacings, to allow a probe assembly to engage the contact pads. Advantageously, example probe bodies and probe assemblies of the present description can be prepared to exhibit reduced widths of probe bodies and segments thereof, front probe body ends that are located with relatively reduced spacing between the front probe body ends, and, consequently, an increased number of probe bodies (per width) in a probe assembly, as compared to previous probe assemblies.

As specific examples, useful or preferred widths of a probe body, e.g., at a location of trailing probe body segment 58, can be less than 40 microns, e.g., from 10 to 35 microns or from 10 to 30 microns. A thickness dimension of probe body layer 2 and bodies and segments thereof can be selected to be sufficient to provide a desired level of electrical conductivity of each probe body 50, and desired mechanical properties (e.g., compressibility, strength) of a spring or stopper segment 60 or 68 of a probe body 50. Examples of useful thickness dimensions of probe body layer 2 and bodies and segments thereof can be in a range from 10 to 30 microns.

Examples of a useful distance between centers of adjacent front probe ends 48 of an array of probe bodies 50 can be in a range from 40 to 80 microns.

To allow for spring segments 50 to flex and compress, spring segments 50 are spaced above (in the z-direction) adhesive layer 4, and trailing probe body segments 58 are held stationary relative to assembly 10, including adhesive layer 4 and base layer 5. Holding probe body segments 58 stationary relative to assembly 10 can be accomplished by any useful mode or structure between probe body segment 58 and another structure of assembly 10, either directly or indirectly, such as by use of one or more adhesive or other type of additional layer of an assembly (e.g., a spacer layer and an adhesive layer), or by use of any other effective bonding or connective structure.

According to one presently useful example, a multi-layer assembly can include structure that secures probe body segments 58 in place relative to a base layer 5 indirectly through one or more adhesive layer 4 and spacer layer 3 as shown at FIGS. 1A, 1B, and 2C, and 2D. As shown at FIG. 2C, spacer layer 3 includes an array of multiple spacer bodies 80, each spacer body 80 extending along a length generally in the x-direction from front spacer body end 82 to trailing spacer body end 84. Spacer bodies 80 and segments thereof may be arranged within layer 3 in an array that includes segments of bodies 80 that are vertically aligned with segments of an array of probe bodies 50 of probe body layer 2 (see FIG. 2B). Consistent therewith, the multiple spacer bodies 80 are arranged in a sequence in the y-direction with separations 86 separating the sides or edges of each spacer body 80 from sides or edges of adjacent spacer bodies 80, with each separation 86 also extending generally in the x-direction between a location of front spacer body end 82 and a location of trailing spacer body end 84. Each spacer body 80 includes at least a trailing spacer body segment 88 that is adjacent to a trailing spacer body end 84. As part of an assembly 10, each trailing spacer body segment 88 can be bonded, e.g., by adhesive, to a bottom of a probe body 50 of probe body layer 2, e.g., along a length and on a bottom of a trailing probe body segment 58 (see FIG. 2B). In this way, trailing spacer body segment 88, bonded to a segment of a probe body 50, is effective to reinforce (for added strength), stiffen, or support the segment of the probe body 50 to which trailing spacer body segment 88 is bonded. In addition, each trailing spacer body segment 88 provides spacing in the z-direction between base 5 and adhesive layer 4, and probe body layer 2. The spacing can result in an open space that extends in the z-direction between each spring segment 60 and a top surface of adhesive layer 4, to allow each spring segment 60 to move, e.g., flex and compress, relative to adhesive layer 4. In other examples of spacer layers, the layer may be an insulating material that is continuous, that does not contain the discrete spacer bodies 80 separated by separation 86, but that otherwise includes features as described that will result in a continuous spacer layer that effectively functions as a spacer layer as described.

Also included as part of spacer layer 3 may be one or more forward spacer body segments 90 adjacent to front spacer body end 82. A forward spacer body segment 90 may be bonded to, e.g., by adhesive, and vertically aligned with a bottom of spacer body 50 (or a segment thereof), e.g., along and on a bottom of an end spring segment 68 as shown at FIG. 2B. In this way, spacer body segment 90 is effective to reinforce (for added strength), stiffen, or support stopper segment 68 of probe body 50.

Alternately or in addition, one or more spacer bodies 50 can include a forward spacer body segment 92 adjacent to front spacer body end 82, that can be bonded, e.g., by adhesive, to a forward segment of a probe body 50, e.g., along and on a bottom of an end probe body 64, or a segment thereof (see FIG. 2B). In this way, forward spacer body segment 92 is effective to reinforce (add strength to), stiffen, or support forward segment 62 of end probe body 64.

A spacer layer such as spacer layer 3 may be made of any material that can be effective to provide a space, in a vertical direction, between probe body layer 2, and adhesive layer 4 and base layer 5. A preferred material can be one that can be prepared into an array of spacer bodies 80 to form spacer layer 3 as described, which can be incorporated into a multi-layer assembly as described. The material of spacer layer 3 may be an insulating material (e.g., a polymer or plastic), a ceramic, or a conductive material such as a metal (including alloys). If the material is a conductive material such as a metal or metal alloy, spaces 86 must be present between adjacent spacer bodies 80. If, instead, spacer layer 3 is made of a non-conductive or insulating material, spaces 86 may be unnecessary.

A spacer layer such as spacer layer 3 can have dimensions that are useful to allow and cause spacer layer 3 to function to place distance, in the z-direction, between probe body layer 2, especially spring segments 60, and a top adhesive surface of adhesive layer 4, optionally also to stiffen or support probe body layer 2 and the non-spring segments of probe bodies thereof. Length and width dimensions of spacer layer 3, spacer bodies 80, and segments thereof, can be selected to match features of probe body layer 2 and segments and bodies thereof, to allow for vertical alignment of segments of the bodies of probe body layer 2 and spacer layer 3. A thickness dimension of spacer layer 3 and bodies and segments thereof can be selected to be sufficient to provide a desired spacing, in the z-direction, between probe body layer 2, especially spring segments 60 thereof, and the top adhesive surface of adhesive layer 4, as well as any desired strengthening or support of segments or bodies of probe body layer 2. Examples of useful thickness dimensions of spacer layer 3 and bodies and segments thereof can be in a range from 10 to 50 microns.

Figures 2D, 2E, 2F:
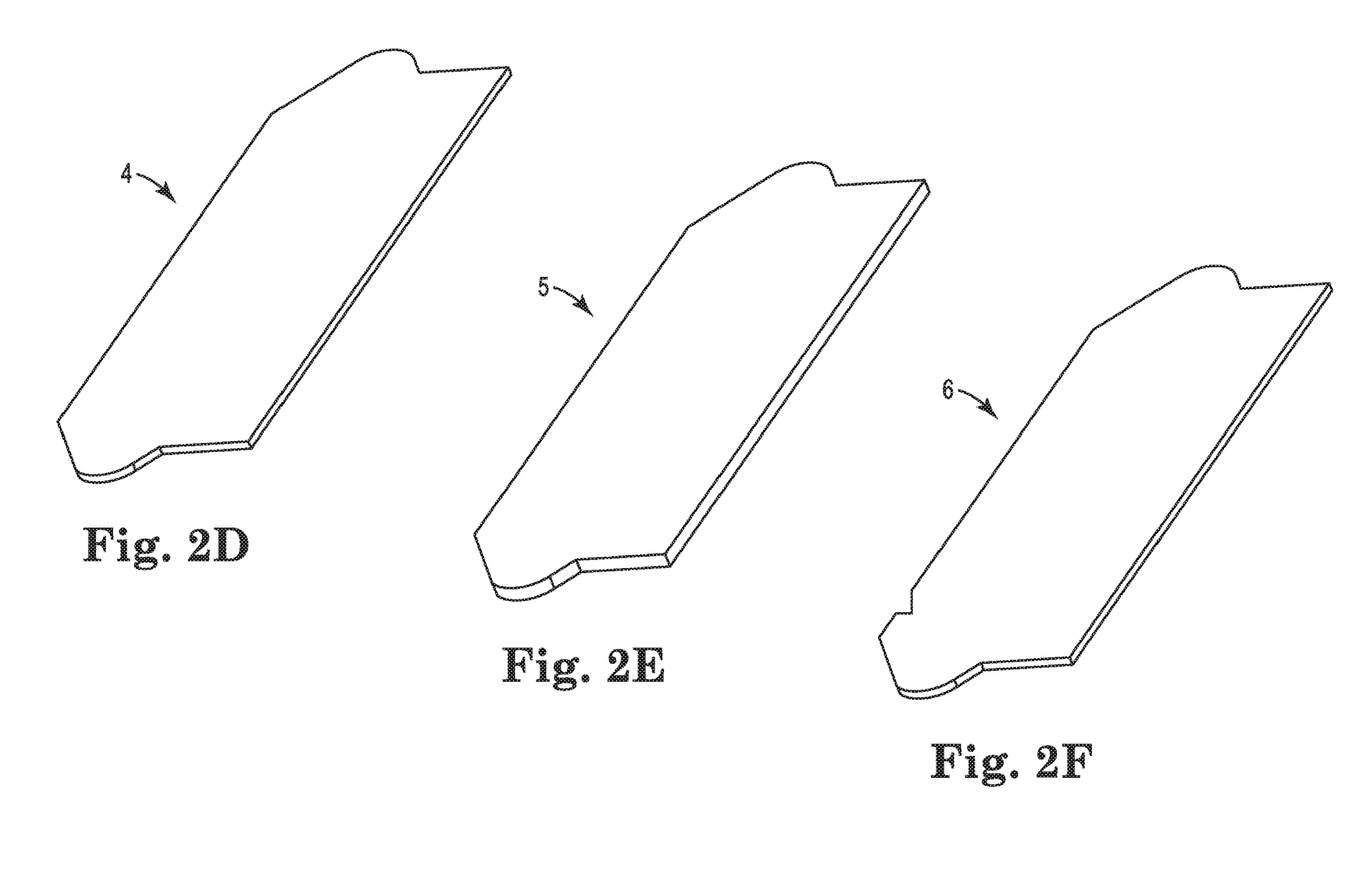
FIG. 2D is a top perspective view of an example adhesive layer of probe assembly as described.
FIG. 2E is a top perspective view of an example base layer of probe assembly as described.
FIG. 2F is a top perspective view of an example adhesive layer of probe assembly as described.

As illustrated at FIG. 1A, adjacent to spacer layer 3 (FIG. 2C) is an adhesive layer 4 (FIG. 2D), which is adjacent to base layer 5 (FIG. 2E). Adhesive layer 4 is bonded to spacer layer 3, or bodies or segments thereof, and is also bonded to base layer 5. Adhesive layer 4 can be made of any electrically insulating (i.e., non-electrically-conductive) adhesive composition, e.g., a non-conductive pressure-sensitive adhesive, that can be effective for this purpose. Adhesive layer 4 can have any effective thickness (in the z-direction), with the thickness being substantially uniform across the length and width dimensions of layer 4. Examples of useful thickness dimensions of adhesive layer 4 can be in a range from 5 to 25 microns.

Base layer 5 is effective to provide support for assembly 10 and layers of assembly 10.

Base layer 5 can have any effective thickness (in the z-direction), with the thickness being substantially uniform across the length and width dimensions of layer 5. Base layer 5 can be made of any useful conductive or non-conductive material, such as an insulating material (e.g., a polymer or plastic), a ceramic, or a conductive materials such as a metal (including alloys), e.g., aluminum or an aluminum alloy, gold or a gold alloy, copper or a copper alloy, silver or a silver alloy, platinum or a platinum alloy, palladium or a palladium alloy, titanium or a titanium alloy, or the like. Base layer 5 can have any effective thickness (in the z-direction), with the thickness being substantially uniform across the length and width dimensions of base layer 5. Examples of useful thickness dimensions of base layer 5 can be in a range from 20 to 50 microns.

In certain embodiments of an assembly 10 can optionally include one or more additional layers, for example a second layer of probe bodies, with each layer of probe bodies being effective to electrically contact different sets of contact pads of a read head, e.g., two different sets of contact pads of a single read head. Each of the two sets of contact pads will be oriented along a face of the read head in the width direction. The two sets of contact pads can also be spaced apart in the vertical direction, in the length direction, or both.

A read head may include a first set of contact pads that electrically connect to one or more read or write heads of a slider, e.g., for perpendicular magnetic recording, which may include one or more transducers for reading magnetically stored digital information from, or writing digital information onto, a magnetic memory disk. The same read head may include a second set of contact pads that electrically connect to a second, separate, electrical function of the slider assembly, such as contact pads of a laser diode unit (LDU). The second set of pads may be spaced away from the first set of pads in the vertical ("z") direction, as well as in the length ("x") direction. Examples of an assembly 10 as described may include a first set of probe bodies adapted to engage the first set of contact pads of the slider assembly, and may additionally include a second set of probe bodies adapted to engage the second set of contact pads of the same slider assembly (e.g., contact pads of a LDU). The first set of probe bodies can include a first set of forward probe body ends, and the second set of probe bodies can include a second set of forward probe body ends. Optionally and preferably, the second set of probe body ends can be spaced in one or more of the x-direction, the y-direction, or the z-direction, relative to the first set of probe body ends.

In one such example an assembly 10 that contains two separate sets of probe bodies separated in the z-direction, and with continued reference to FIGS. 1A and 1B, a second adhesive layer 6 (see FIG. 2F) may be included in assembly 10 on a lower (bottom, second) side of base layer 5. A second probe body layer 8 (e.g., "second probe body layer," or "lower probe body layer" 8) is separated from base layer 5, and from a "second" or "lower" adhesive layer 6, by "second" or "lower" spacer layer 7. Layer 9, adjacent to probe body layer 8, is a "second" or "lower" stiffener layer.

Figures 2G, 2H, 2I:
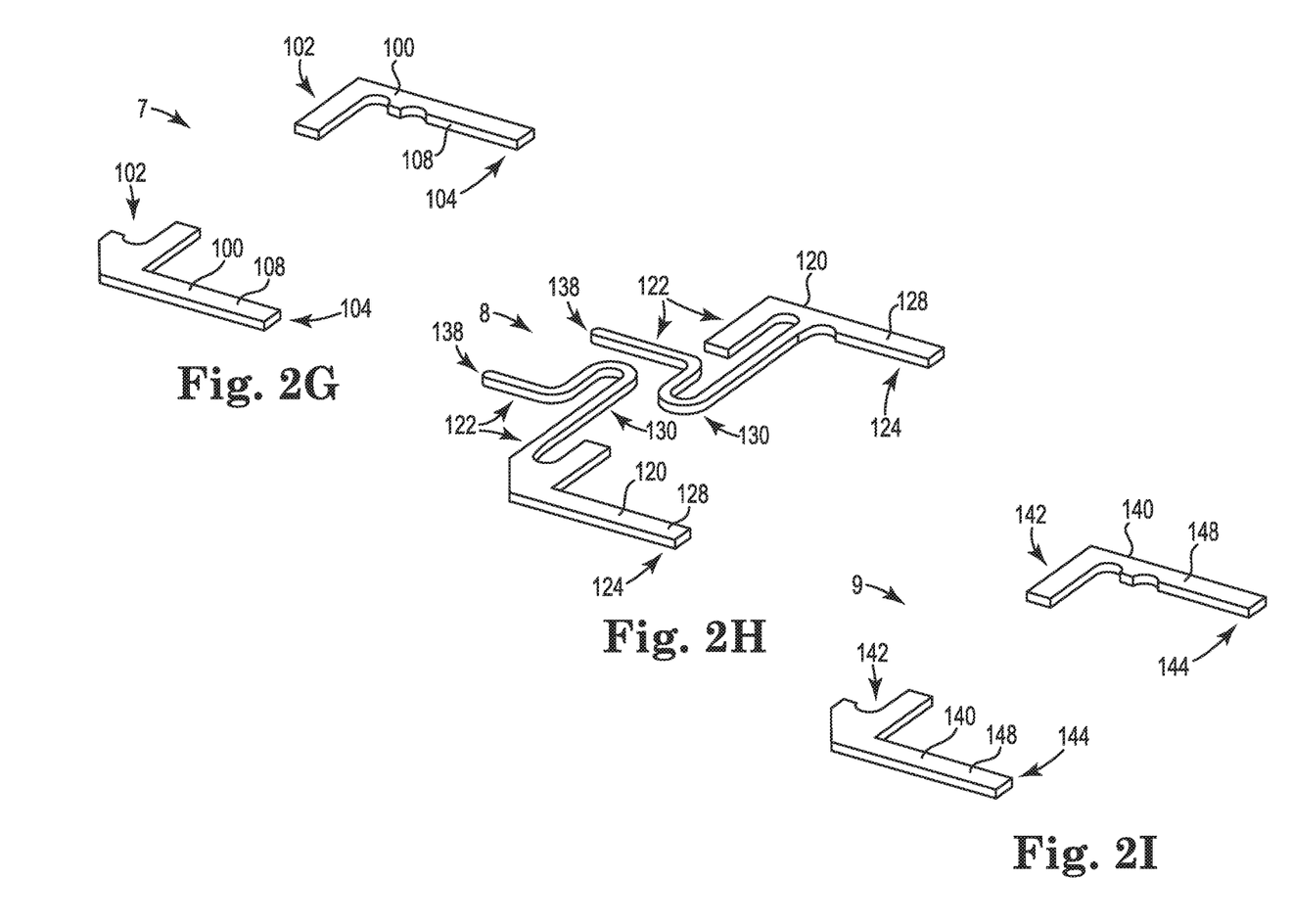
FIG. 2G is a top perspective view of an example second spacer layer of probe assembly as described.
FIG. 2H is a top perspective view of an example second probe body layer of a probe assembly as described.
FIG. 2I is a top perspective view of an example second stiffener layer of a probe assembly as described.

As shown at FIG. 2G, spacer layer 7 includes an array of spacer bodies 100, each spacer body 100 extending along a length generally in the x-direction from front spacer body end 102 to trailing spacer body end 104. The spacer bodies 100 can be arranged in a sequence along the y-direction, optionally with segments that are vertically aligned with segments of probe bodies 120 of probe body layer 8 (see FIG. 2H). Each spacer body 100 includes at least a trailing spacer body segment 108 that is adjacent to a trailing spacer body end 104. As part of assembly 10, a bottom side of each trailing spacer body segment 108 can be aligned vertically with and bonded to, e.g., by adhesive, a top side of a probe body 120 of probe body layer 8, e.g., along a length and on top of a trailing probe body segment 128 (see FIG. 2H). A top side of spacer body 100 can be bonded to a bottom side of second adhesive layer 6. In this way, each trailing spacer body segment 108, vertically aligned with and bonded to a segment of a probe body 120 and also to adhesive layer 6, is effective to provide a vertical distance between probe layer 8 (including bodies and segments thereof, including spring segments 130), and adhesive layer 6. Spacer layer 7 can have dimensions that are comparable or similar to the dimensions of other spacer layers of an assembly 10, and can be made of the same materials.

As shown at FIG. 2H, probe body layer 2 includes an array of probe bodies 120, each body 120 extending along a length generally in the x-direction from front probe body end 122 to trailing probe body end 124. The probe bodies 120 are also arranged along the y-direction. A probe body 120 can include a front probe body portion that includes a spring segment 130 and a front probe end 138, and a trailing probe body segment 128 that is adjacent to trailing probe body end 124. Each trailing probe body segment 128 is held in place relative to assembly 10, e.g., relative to base layer 5. Probe body layer 8 and probe bodies 120 are spaced in the z-direction from base layer 5 and adhesive layer 6, so that spring segments 130 are allowed to flex and compress in the x direction.

In use, contact pads (not shown) of a read head engage each of front probe ends 138 when probe assembly 10 (with second probe layer 8) is included as part of a suspension assembly for electronic testing of read heads. As one non-limiting example, front probe ends 138 can be adapted to engage electrical contact pads of a read head that are in electrical contact with a laser diode unit (LDU) of a read head (e.g., a HAMR slider) that also includes additional contact pads in electrical contact with another electronic feature such as a magnetic read-write head having a transducer, e.g., a PMR read head. The front probe ends 138 engage the contact pads in a manner to produce an electrical connection between each front probe end 138 and one of the contact pads of the read head. The read head places pressure on spring segments 130 in the x-direction toward trailing end 124. Each spring segment 130 can become compressed to shorten in the x-direction, flexing in the x-direction and in the y-direction.

Probe body layer 8 can have dimensions that are comparable or similar to the dimensions of other probe body layers of an assembly 10, and can be made of the same materials.

As shown at FIG. 2I, optional stiffener layer 9 includes an array of stiffener bodies 140, each body 140 extending along a length generally in the x-direction from front stiffener body end 142 to trailing stiffener body end 144. The stiffener bodies 140 can be arranged at locations along the y-direction to vertical align segments of bodies 140 with segments of probe bodies 120 of probe body layer 8 (see FIG. 2H). Each stiffener body 140 includes at least a trailing stiffener body segment 148 that is adjacent to a trailing stiffener body end 144. As part of assembly 10, a top of each trailing stiffener body segment 148 can be bonded, e.g., by adhesive, to a bottom of a probe body 120, e.g., along a length and on bottom of a trailing probe body segment 128 (see FIG. 2H). In this way, each trailing stiffener body segment 148, bonded to a segment of a probe body 120, is effective to reinforce (for added strength), stiffen, or support the segment of the probe body 120 to which the segment of the trailing body stiffener is bonded.

The probe assembly as described can be used in a suspension assembly of a dynamic electrical sensor system to provide temporary electrical connection to one or multiple sets of contact pads of a slider during electrical testing, optionally including both a first set of contact pads for magnetic recording and reading (e.g., perpendicular magnetic recording), and a second set of contact LDU pads. The electrical probe assemblies are integrated into a suspension assembly, usually as part of a head gimbal assembly that includes a holder (e.g., a mechanical clamp) that holds the slider in place within the suspension, as well as electrical connections that connect the slider, through the probe assembly, to the suspension assembly and ultimately to the testing system. With the slider placed in the assembly, e.g., into an open clamp, the clamp can be closed and will push the slider (and optional LDU) against probe ends of the probe assembly. The probes can be designed to compress in the length (x) direction, so that no lateral force is generated. Two end probe bodies (stoppers) at ends or edges of an array of probe bodies are stiffer than the spring segments of the interior probe bodies.

Figure 2J:
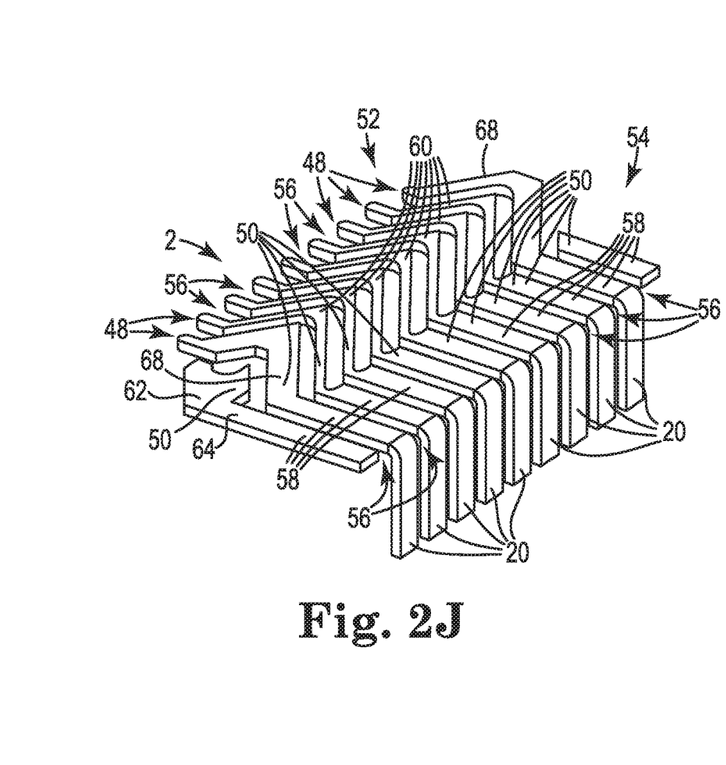
FIG. 2J is a top perspective view of an example probe body layer of a probe assembly as described.
Figure 2K:
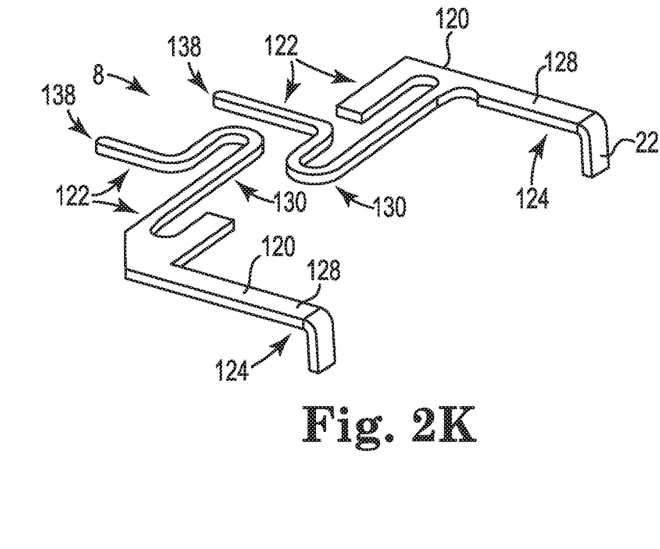
FIG. 2K is a top perspective view of an example second probe body layer of a probe assembly as described.

Because the probe assembly is built out of multiple layers stacked in the vertical (z) direction, the design allows for making electrical connections to contact pads of a slider that are in two or more different planes (in the z-direction) of the slider (as well as in two or more different locations in the x-direction). To connect the probes to a typical suspension assembly, e.g., by way of a head gimbal assembly, the probe assemblies can include an electrical end connector that extends from a probe trailing end (within the probe body layer), downward and in the vertical direction (z-direction), e.g., at a ninety degree angle relative to the probe bodies. Individual electrical end connectors can extend from each of the probe trailing ends, in a "downward" direction toward a contact pad of an electrical circuit, e.g., of a laminated flexure, to a location that is very close to corresponding contact pad of the flexure. Examples of electrical end connectors 20 and 22 are shown at FIGS. 2J and 2K, as part of assembly 10, for connecting first probe body layer 2 and second probe body layer 8 to electrical contact pads, e.g., of a laminated flexure.

Figure 3A:
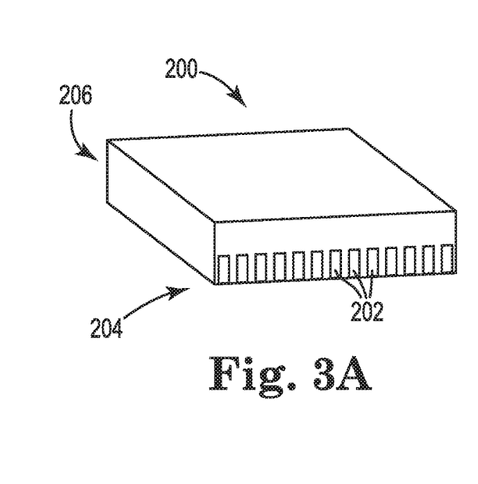
FIGS. 3A, 3B, and 3C show examples of sliders that can be electrically connected to a probe assembly as described.
Figure 3B:
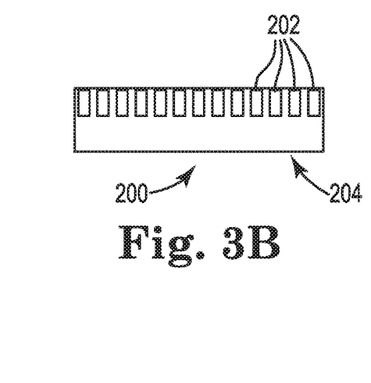
Figure 3C:
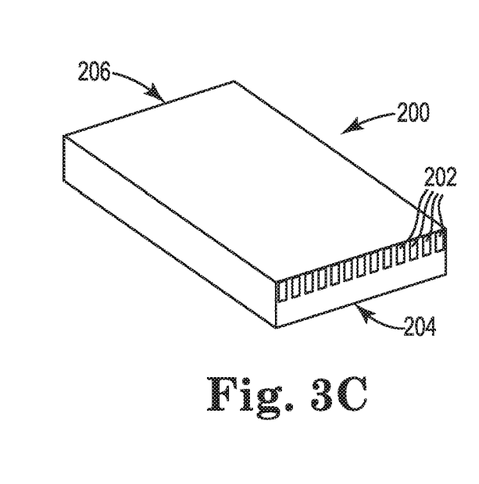
Figure 4A:
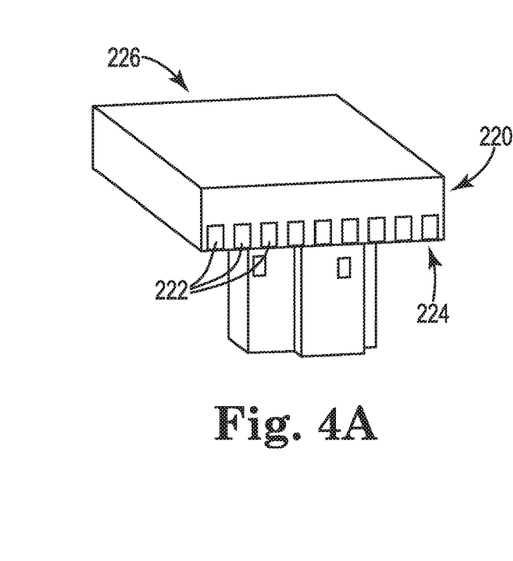
FIGS. 4A, 4B, and 4C show examples of sliders that can be electrically connected to a probe assembly as described.
Figure 4B:
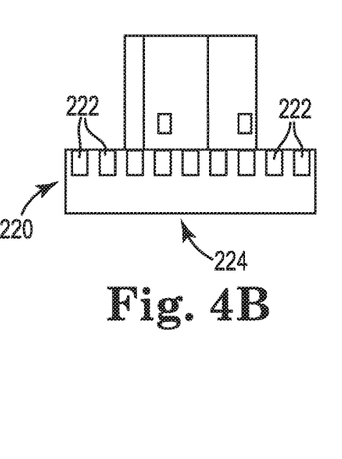
Figure 4C:
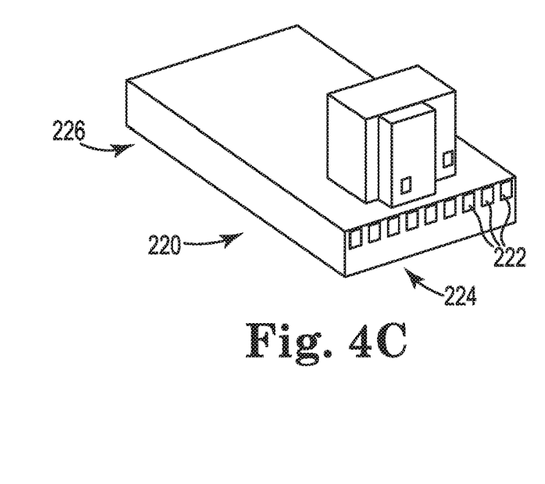

Referring to FIGS. 3A, 3B, 3C, 4A, 4B, and 4C, these show an example of a PMR slider (FIGS. 3A, 3B, and 3C), and a slider that includes LDU functionality in addition to PMR functionality (FIGS. 4A, 4B, and 4C). FIGS. 3A, 3B, and 3C are a trailing end perspective view, an end view, and a second trailing end perspective view, respectively. FIGS. 4A, 4B, and 4C are a trailing end perspective view, an end view, and a second trailing end perspective view, respectively.

Example slider PMR slider 200 of FIGS. 3A, 3B, and 3C includes trailing end 204, front end 206 and a length in an x-direction between them. Contact pads 202 are arranged in an array in a width direction on a face of trailing end 204.

Example slider PMR slider 220 of FIGS. 4A, 4B, and 4C includes trailing end 224, front end 226 and a length in an x-direction between them. Contact pads 222 are arranged in an array in a width direction on a face of trailing end 204.

In use, each of slider 200 and 220 can be inserted into a head gimbal assembly to bring contact pads 202 and 222 into electrical engagement with probe ends of a probe assembly as described herein, for example with the probe assembly being a component of the head gimbal assembly, which is in turn a component of a suspension assembly of a dynamic electrical testing system. Examples of head gimbal assemblies, suspension assemblies, and testing systems and assemblies are described in U.S. Pat. Nos. 8,089,730, and 8,514,522, the entireties of which are incorporated herein by reference.

Figure 5A:
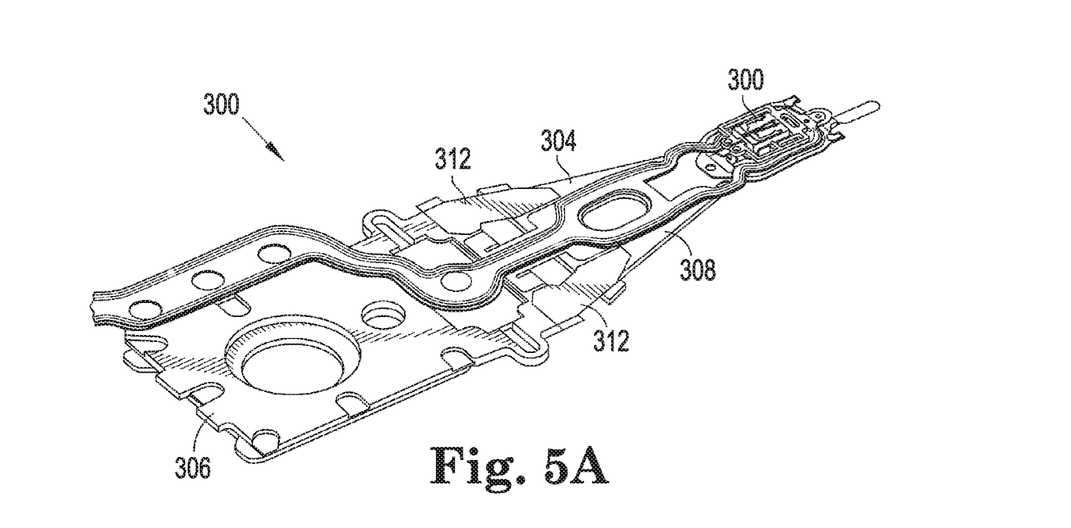
FIGS. 5A and 5B illustrate example head gimbal assemblies as described.
Figure 5B:
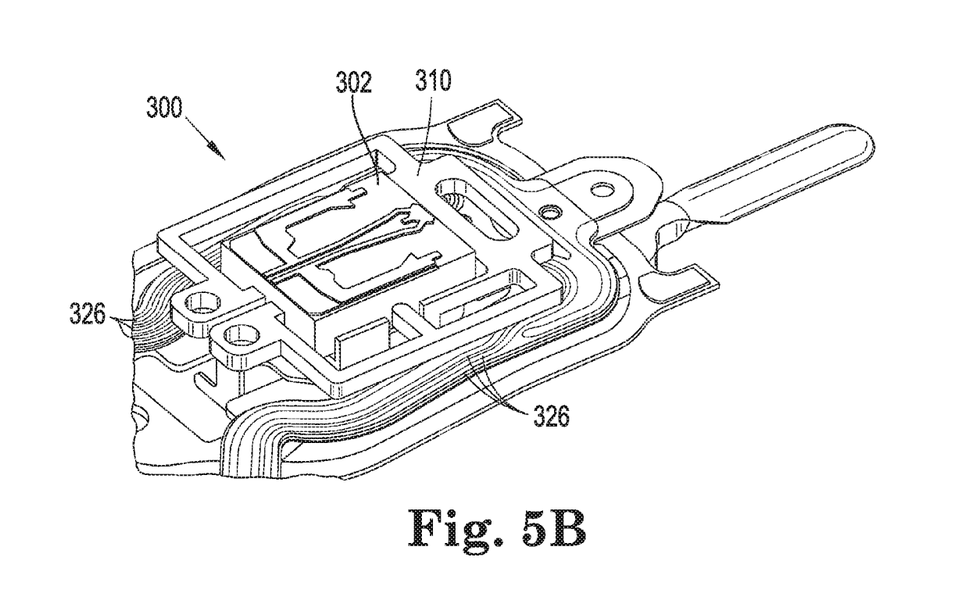

Referring now to FIGS. 5A and 5B, FIG. 5A is a top perspective view of a head gimbal assembly (HGA) 300 that includes read head 302 and a suspension assembly 304 according to an embodiment of the present invention. Suspension assembly 304 holds the read head 302, temporarily, for testing, by providing electrical connection to the read head and electrical functionality thereof. Suspension assembly 304 includes a suspension mounting plate 306, and a load beam 308 attached to the suspension mounting plate 306 (for example via hinge plates 312). Suspension assembly 304 also includes laminated flexure 320, which includes conductive traces 326 that electrically connect the probe assembly of the head gimbal assembly to a dynamic electrical testing system (not shown).

Referring to FIG. 5B, depicted is a portion of the HGA 300 of FIG. 5A. Laminated flexure 320 includes a plurality of conductive traces 326, which are in electrical contact with conductive pads (not shown) of the laminated flexure, which are electrically connected (e.g., through electrical end connectors as described) to probe bodies of one or more probe body layers of a probe assembly as described. Suspension assembly 304 also includes a read head clamp 310 attached to laminated flexure 320. Read head clamp 310 includes a central opening or space that is adapted to temporarily hold read head 302 in place, with contact pads (not show) of read head 302 in electrical contact with conductive ends of probe bodies of the probe assembly.

The invention claimed is:

1. A multi-layer electrical probe assembly comprising:
a base layer having a width in a y-direction, a length in an x-direction extending between a front assembly portion and a trailing assembly portion, and a thickness in a z-direction,
an adhesive layer having a top adhesive surface,
a probe body layer spaced in a z-direction from the adhesive layer and comprising an array of multiple electrically conductive probe bodies, each probe body comprising:
a front probe body portion comprising:
a spring segment capable of flexing in the x-direction and along the y-direction,
a front probe end at a front end of the spring segment, and
a trailing probe body segment held in place relative to the base layer.

2. A probe assembly of claim 1 wherein:
each probe body has a length extending between the front probe body portion and the trailing probe body segment,
the probe bodies are arranged with the length of each probe body aligned and extending in the x-direction, and
the probe bodies are arranged within the probe body layer in a sequence along the y-direction and with separation along the y-direction between the probe bodies.

3. A probe assembly of claim 1 wherein the probe ends are separated in the y-direction by a distance in a range from 40 to 80 microns, measured between centers of the probe ends.

4. A probe assembly of claim 1 comprising at least 7 probe bodies.

5. A probe assembly of claim 1 comprising at least 13 probe bodies.

6. A probe assembly of claim 1 wherein the spring portions are nested within the probe body layer.

7. A probe assembly of claim 1 comprising a spacer layer between the adhesive layer and the probe body layer, the spacer layer comprising a spacer disposed between the trailing probe body segment and the top adhesive surface to provide separation in the z-direction between the spring portion and the top adhesive surface.

8. A probe assembly of claim 1 wherein the front probe end of each probe body is adapted to contact a contact pad of a read head to produce an electrically conductive engagement between the front probe end and the read head.

9. A probe assembly of claim 1 wherein the trailing probe body segment comprises a trailing probe end adapted to be electrically connected to a conductive pad of a laminated flexure.

10. A probe assembly of claim 1 comprising:
a lower probe body layer spaced in a z-direction from the base layer and comprising a second array of multiple electrically conductive probe bodies, each probe body of the second array comprising:
a front probe body portion comprising:
a spring segment capable of flexing in the x-direction and along the y-direction, and
a front probe end at a front end of the spring segment, and
a trailing probe body segment held in place relative to the base layer.

11. A probe assembly of claim 10 wherein the front probe ends of the probe bodies of the second array are adapted to contact a laser diode unit of a heat-assisted magnetic recording slider to produce an electrically conductive engagement between the front probe ends of the probe bodies of the second array and the laser diode unit.

12. A suspension assembly for holding a read head and providing electrical connection to the read head, the suspension assembly comprising:
a laminated flexure comprising a plurality of conductive lines, a read head clamp attached to the laminated flexure, the read head clamp comprising a wall positioned to face a trailing face of the read head, an electrical probe assembly aligned with the wall and having a width in a y-direction and a length in an x-direction extending between a front assembly portion and a trailing assembly portion, the probe assembly comprising an array of multiple electrically conductive probe bodies, each probe body comprising:

a front probe body portion comprising:
  a spring segment capable of flexing in the x-direction and along the y-direction,
  a front probe end at a front end of the spring segment, and
a trailing probe body segment held in place relative to the electrical interconnect probe assembly, wherein each front probe end is adapted to contact a contact pad of a read head to produce an electrically conductive engagement between the front probe end and the contact pad, and wherein each trailing probe body segment is electrically connected to one of the plurality of conductive lines.

13. A suspension assembly of claim 12 containing a read head in the read head clamp, the read head comprising multiple contact pads, wherein the probe end of each probe body is in electrical contact with one of the contact pads.

14. A suspension assembly of claim 12 wherein the probe ends are separated in the y-direction by a distance in a range from 40 to 80 microns, measured between centers of the probe ends.

15. A suspension assembly of claim 12 comprising at least 7 probe bodies, wherein the read head comprises at least 7 contact pads.

16. A suspension assembly of claim 12 wherein the electrical interconnect probe assembly comprises:

a second probe assembly comprising a second array of multiple electrically conductive probe bodies, the second array being spaced in the z-direction from the probe assembly, each probe body of the second array comprising:

a front probe body portion comprising:
  a spring segment capable of flexing in the x-direction and along the y-direction, and
  a front probe end at a front end of the spring segment, and
a trailing probe body segment held in place relative to the electrical interconnect probe assembly, wherein each front probe end of the second array is adapted to contact a contact pad of a read head to produce an electrically conductive engagement between the front probe end and the contact pad of the read head, and wherein each trailing probe body segment is electrically connected to one of the plurality of conductive lines.

17. A suspension assembly of claim 16 containing a read head in the read head clamp, wherein the read head comprises a second set of electronic contact pads in communication with a laser diode unit, wherein the front probe end of each probe body of the second probe assembly is in electrical contact with one of the contact pads in communication with the laser diode unit.

18. A method of using a suspension assembly of claim 16, the method comprising:
  placing a read head in the clamp, and
  electronically testing the read head.

19. A method of claim 18 wherein the read head includes at least 13 electrical contact pads.

20. A method of claim 18 wherein the read head includes a laser diode unit.

* * * * *